(12) United States Patent  
Adamec

(10) Patent No.: US 8,530,837 B2  
(45) Date of Patent: Sep. 10, 2013

(54) ARRANGEMENT AND METHOD FOR THE CONTRAST IMPROVEMENT IN A CHARGED PARTICLE BEAM DEVICE FOR INSPECTING A SPECIMEN

(75) Inventor: Pavel Adamec, Haar (DE)

(73) Assignee: ICT Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 0 days.

(21) Appl. No.: 13/204,528

(22) Filed: Aug. 5, 2011

(65) Prior Publication Data

US 2012/0261573 A1  Oct. 18, 2012

(30) Foreign Application Priority Data

Apr. 13, 2011 (EP) .................................... 11162291

(51) Int. Cl.
- *H01J 37/285* (2006.01)
- *G01N 23/00* (2006.01)
- *G21K 7/00* (2006.01)

(52) U.S. Cl.  
USPC ............................ 250/310; 250/306; 250/307

(58) Field of Classification Search  
USPC ...... 250/306, 307, 309–311, 396 R, 396 ML, 250/397–399, 492.1, 492.2, 492.3, 492.21  
See application file for complete search history.

(56) References Cited

U.S. PATENT DOCUMENTS

| | | | |
|---|---|---|---|
| 8,164,067 B2 * | 4/2012 | Adamec et al. | 250/397 |
| 2002/0033449 A1 * | 3/2002 | Nakasuji et al. | 250/306 |
| 2003/0230714 A1 | 12/2003 | Yonezawa | |
| 2005/0045821 A1 * | 3/2005 | Noji et al. | 250/311 |
| 2006/0226361 A1 * | 10/2006 | Frosien et al. | 250/310 |
| 2010/0200748 A1 * | 8/2010 | Adamec et al. | 250/307 |

FOREIGN PATENT DOCUMENTS

| | | |
|---|---|---|
| EP | 2219204 A1 | 8/2010 |
| JP | 60189855 A | 9/1985 |

OTHER PUBLICATIONS

Extended European Search Report dated Sep. 20, 2011 for EPC Application No. 11162291.6.

* cited by examiner

*Primary Examiner* — Bernard E Souw  
(74) *Attorney, Agent, or Firm* — Patterson & Sheridan, L.L.P.

(57) ABSTRACT

A charged particle beam device for inspecting a specimen includes a charged particle beam source adapted to generate a primary charged particle beam; an objective lens device adapted to direct the primary charged particle beam onto the specimen; a retarding field device adapted to accelerate secondary charged particles starting from the specimen, a first detector device having a central opening, includes at least two azimuthal detector segments for detecting secondary particles, wherein the objective lens device is adapted such that particles with different starting angles from the specimen exhibit crossovers at substantially the same distance from the specimen between the objective lens and the detector device, and an aperture located between the objective lens and the crossovers, having an opening which is equal to or smaller than the central opening in the detector device.

15 Claims, 4 Drawing Sheets

ARRANGEMENT AND METHOD FOR THE CONTRAST IMPROVEMENT IN A CHARGED PARTICLE BEAM DEVICE FOR INSPECTING A SPECIMEN

FIELD OF THE INVENTION

This disclosure generally relates to a charged particle beam device and a method of imaging specimen with a charged particle beam, particularly for inspection applications, testing applications, lithography applications and the like. More particularly, it relates to an improvement of the contrast, especially topographic contrast in scanning beam instruments. Specifically, it relates to a charged particle beam device and a method of inspecting a specimen with a charged particle beam device.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for inspecting specimens within the micrometer and nanometer scale.

Micrometer and nanometer scale process control, inspection or structuring, is often done with charged particle beams, e.g. electron beams or ion beams, which are generated and focused in charged particle beam devices, such as Scanning Electron Microscopes (SEM) or Focused Ion Beam (FIB) tools. Charged particle beams offer superior spatial resolution compared to e.g. photon beams, due to their short wavelengths.

A prominent tool for inspections is the Scanning Electron Microscope (SEM), an example of which is shown in FIG. 1. FIG. 1 illustrates as a typical example of a charged particle beam device a SEM 1, which includes a beam tube 20 having an electron beam source 5, e.g. a thermal field emission cathode, to generate a primary electron beam 7, a high voltage beam tube 9 to accelerate the primary electron beam 7 up to an energy controlled by an anode voltage $V_{anode}$, a condenser 11 to improve the electron beam shape, a magnetic focusing lens 13 and an electrostatic focusing lens 14 to focus the primary electron beam 7 onto a specimen 3. The SEM 1 of FIG. 1 further includes an in-lens detector 15, e.g. a position sensitive detector, to detect and evaluate the signal of the secondary electrons 17 which are generated by the primary electron beam 7 on the specimen 3.

The magnetic focusing lens 13 of FIG. 1 consists of a coil 24 and a yoke 26 shaped to generate a focusing magnetic field for the primary electron beam 7. The electrostatic focusing lens 14 of FIG. 1 includes the lower-end elements 9a of the high voltage beam tube 9, the cone-like shaped elements 26a, i.e. conical cap, of yoke 26, and apertures 16 at the apices of the respective elements. The focusing electric field is defined by the geometry of the lower-end element 9a, of the conical cap, their apertures 16 and by the voltages V1 and V2 between the specimen 3 and, respectively, the conical cap 26a and the high voltage beam tube 9. If the electric field between the conical cap 26a and specimen 3 is adjusted in such a way that it decelerates the primary electron beam 7, i.e. if a retarding electrical field is employed, the spatial resolution of the probing primary electron beam can be increased when combined with a magnetic focusing field. More details about the combined electrostatic and magnetic focusing lens, and about the SEM of FIG. 1 in general, can be found in "*High Precision electron optical system for absolute and CD-measurements on large specimens*" by J. Frosien, S. Lanio, H. P. Feuerbaum, Nuclear Instruments and Methods in Physics Research A, 363 (1995), pp. 25-30.

While a SEM uses a focused primary electron beam to image a specimen, a FIB instead uses a focused primary ion beam, typically gallium ions. During scanning of the primary ion beam over the specimen, secondary electrons and ions are generated which may be collected to form an image of the surface of the specimen. The FIB can also be incorporated in a system with both electron and ion beam columns, allowing the same feature to be investigated using either of the beams. If the following description names "electrons" or an "electron beam" in various respects, it thus intended that this may also be applicable for ions, unless otherwise stated.

For detection and classification of topographic defects, like particles, at the surface of specimens, a good topographic contrast is necessary. In scanning beam applications, topographic contrast may be obtained by detection of secondary electrons or ions having different starting angles from the specimen. In scanning beam tools the secondary electrons or ions produced at the specimen are usually collected over a broad range of starting angles for imaging the specimen. When using for instance a low energy SEM utilizing a retarding field objective lens for imaging a specimen, substantially all secondary electrons produced at the surface of the specimen may be attracted inside the objective lens and may therefore be detected.

However, if the topography of the observed feature is not very pronounced, the topographic contrast is weak and the background signal plays an important role. In view of the above, there is a need for a scanning beam apparatus with improved contrast.

SUMMARY OF THE INVENTION

In light of the above, a charged particle beam device according to claim 1 and a method of inspecting a specimen with a charged particle beam device according to claim 8 are provided.

In one aspect, a charged particle beam device for inspecting a specimen is provided. It includes a charged particle beam source adapted to generate a primary charged particle beam; an objective lens device adapted to direct the primary charged particle beam onto the specimen; a retarding field device adapted to accelerate secondary charged particles starting from the specimen, a first detector device, including at least two detector segments for detecting secondary particles, wherein the objective lens device is adapted such that particles with different starting angles from the specimen exhibit crossovers at substantially the same distance from the specimen, and a first aperture located between the objective lens and the detector, having an opening with a diameter equal to or smaller than a central opening in the detector device, and which is provided in a position which fulfills at least one of the following properties: (i) it is in the vicinity of the crossovers, (ii) it is at a position where stray electrons exhibit a maximum spread.

In a further aspect, a method of inspecting a specimen with a charged particle beam device is provided. The method includes generating a primary charged particle beam on a first optical axis; focusing the primary charged particle beam onto the specimen using an objective lens device; generating a secondary charged particle beam by the primary charged particle beam at the specimen, the secondary charged particle beam including a first group of secondary charged particles starting from the specimen with high starting angles and a second group of secondary charged particles starting from the specimen with low starting angles; focusing the secondary charged particle beam, such that particles from the first group and from the second group exhibit crossovers in substantially the same distance from the specimen; blocking stray electrons with an aperture disposed between the objective lens and the crossovers; and detecting particles of the secondary charged particle beam.

Further advantages, features, and details are evident from the dependent claims, the description and the drawings.

Embodiments are also directed to apparatuses for carrying out the disclosed methods and including apparatus parts for performing described method steps. Furthermore, embodiments are also directed to methods by which the described apparatus operates or by which the described apparatus is manufactured. It may include method steps for carrying out functions of the apparatus or manufacturing parts of the apparatus. The method steps may be performed by way of hardware components, firmware, software, a computer programmed by appropriate software, by any combination thereof or in any other manner.

BRIEF DESCRIPTION OF THE DRAWINGS

So that the manner in which the above recited features can be understood in detail, a more particular description of embodiments, briefly summarized above, may be had by reference to embodiments. The accompanying drawings relate to embodiments of the invention and are described in the following. It is contemplated that elements of one embodiment may be advantageously utilized in other embodiments without further recitation.

Some of the above mentioned embodiments will be described in more detail in the following description of typical embodiments with reference to the following drawings in which.

DETAILED DESCRIPTION OF THE DRAWINGS

Reference will now be made in detail to the various embodiments, one or more examples of which are illustrated in the figures. Each example is provided by way of explanation, and is not meant as a limitation of the invention.

Without limiting the scope of the present application, in the following the examples of embodiments described herein include a secondary electron microscope (SEM) as a typical charged particle beam device for inspecting a specimen. However, the examples and embodiments described herein may also be applied to other charged particle beam devices, in particular scanning charged particle beam devices, such as FIB. Hence, the examples and embodiments described in the following may be used for inspecting a specimen using electrons or ions as primary and/or secondary charged particle beams. Furthermore, the examples and embodiments of SEMs described herein include a combined magnetic and electrostatic objective lens designed as a retarding field objective lens. The embodiments may, however, also be applied to charged particle devices, e.g. SEMS, including other types of objective lenses, e.g. a magnetic objective lens, an electrostatic objective lens, and a combined magnetic and electrostatic objective lens not utilizing a retarding field. As described herein, reference to secondary particles or a secondary charged particle beam can be understood as reference to any secondary and/or backscattered particles or beams of secondary and/or backscattered particles, respectively.

Within the following description of the drawings, the same reference numbers refer to the same components. Generally, only the differences with respect to the individual embodiments are described. If embodiments refer to electrons, the use of other particles as described above is generally intended to be equally disclosed.

A typical application of a charged particle beam device for inspecting a specimen according to examples of embodiments described herein is the inspection of device structures in semiconductor industry. For example, a "specimen" as referred to herein, includes, but is not limited to, wafers, semiconductor devices, other electronic components, and solar cells. Other specimens requiring a micrometer and nanometer scale process control, inspection or structuring may be contemplated. Further, in the following the expression "common crossover" describes that a plurality of electrons having different starting angles from a specimen are focused in a common geometrical location or space having a defined distance from a specimen, which is further described below.

Figure 1:
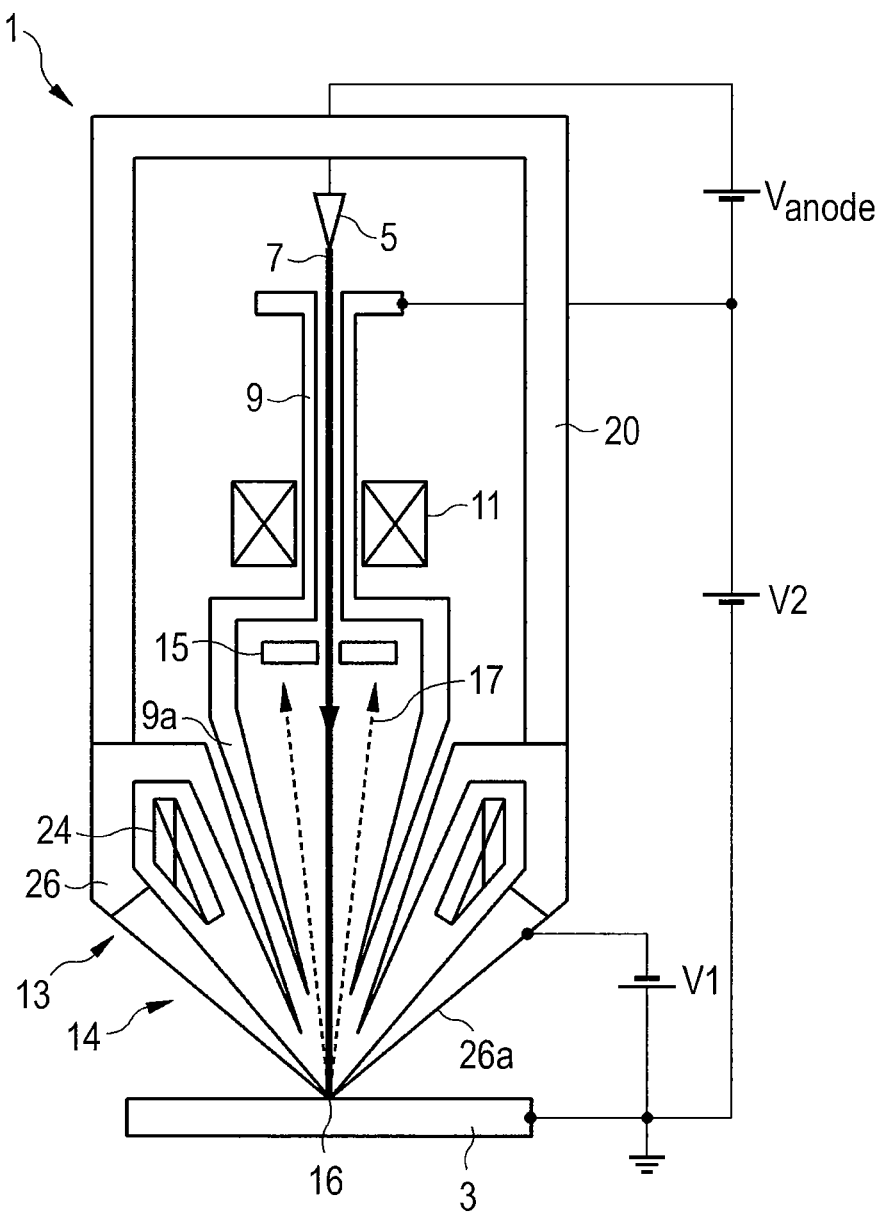
FIG. 1 shows an example of a Scanning Electron Microscope (SEM)
Figure 2:
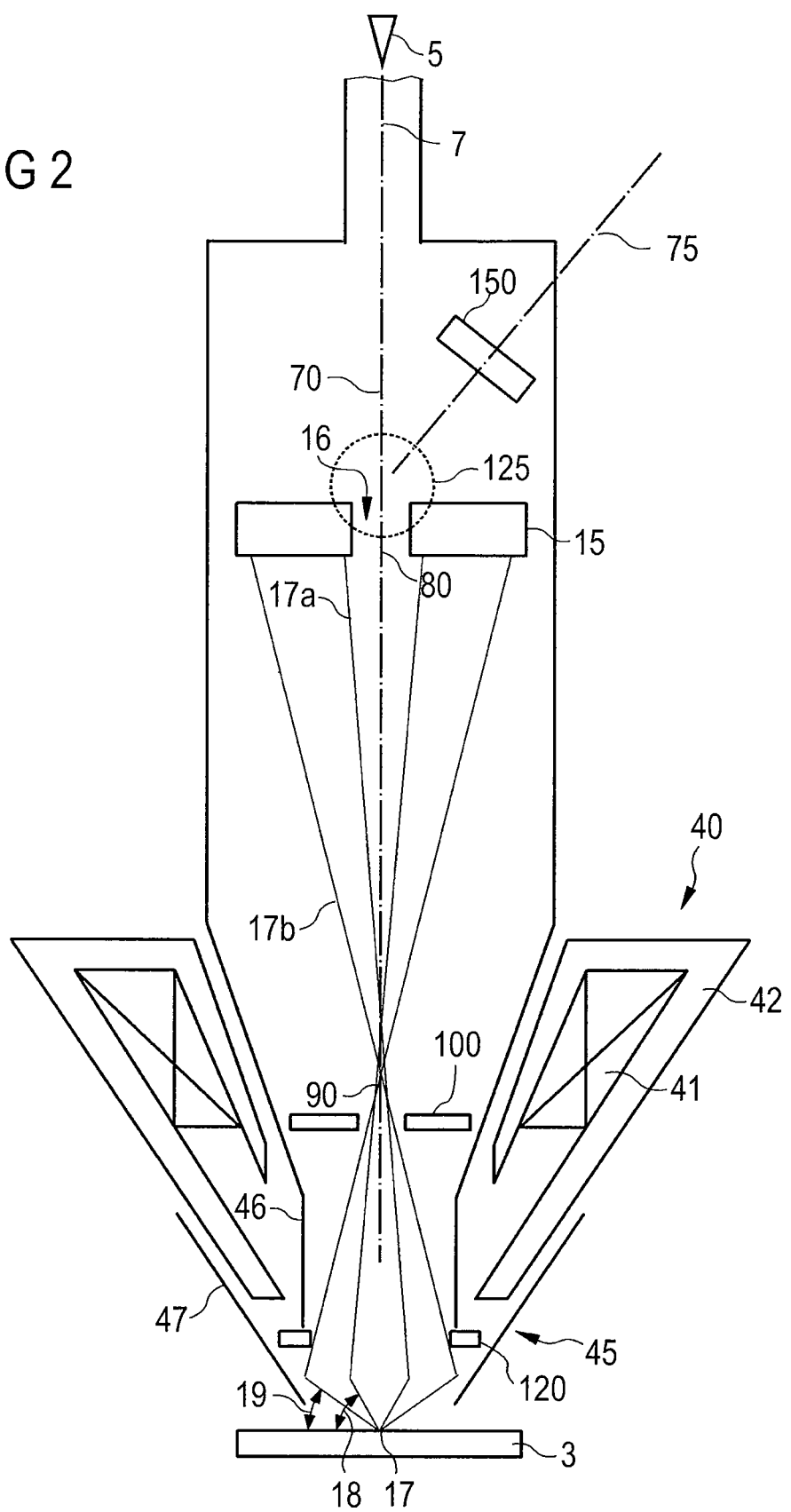
FIG. 2 shows a cross sectional view of particle beam apparatus according to embodiments.

FIG. 2 shows a SEM according to embodiments, which may be combined with other embodiments described herein. For inspection of the specimen 3, the primary electron beam (not shown) is generated along the optical axis 70, and the primary electron beam is directed onto the specimen 3 using the objective lens device 40, 45. Then, the secondary electron beam is generated by the primary electron beam at the specimen 3. Substantially the entire secondary electron beam or a part thereof is passing back through the lens device 40, 45. When the secondary electrons were reflected by a defect on the sample 3, they have an angular distribution different from that of the secondary electron beam reflected by a plane section of the specimen. Hence, if the primary electron beam is reflected by a section of the specimen 3 including any type of defect, the average number of electrons per time unit which hit different areas of detector 15 differ from the respective numbers when no defect is present at the impact spot of the beam.

In embodiments, this difference is used to distinguish between areas of the wafer with a defect and intact areas. In order to be able to distinguish between particle counts of secondary electrons having different starting angles, there are distinct detection areas. To this end, the detector 15 is divided into different detection areas. In embodiments, the detector has a circular shape with an angular opening in the middle. This opening serves both for letting pass the primary beam coming from the particle source and for letting pass secondary electrons with a high starting angle, which have a movement vector close to the axis of the primary beam. As it is hard to distinguish whether these electrons were reflected by a defect or by an intact surface part, they are of less value for the detection. More suitable are electrons with a low starting angle, i.e. with a moving vector having an angle of 0 degrees to about 45 degrees to the plane of the specimen. Two of the trajectories of secondary electrons are symbolized by lines 17a and 17b in FIG. 2. As can be seen, the electrons having trajectories 17a and 17b coming from the specimen are focused by objective lens device 40, 45. The objective lens device is configured such that electrons with arbitrary different starting angles 18, 19 from the specimen are focused in substantially the same distance from the specimen in a common crossover 90, 91. The terms "same distance" and "common crossover" mean, that the variation of the distance (along the optical axis 70 or axes 70, 72, 75) of the individual crossovers to specimen 3 between particles 18 with a high starting angle (in this particular example, 75 degrees) and particles 19 with a low starting angle (in this particular example, 25 degrees) is smaller than 20 percent, more typically smaller than 15 percent, even more typically smaller than 10 percent. The common crossover 90, 91 is defined as the geometrical spot in the middle between the two crossovers of low and high starting angle particles, respectively, as defined above.

Since the aperture 16 of the detector 15 lets pass secondary electrons having a higher angle than the electrons on trajectory 17a, electrons having higher starting angles and thus carrying little topographic information pass though the detector 15, while electrons with trajectories in the angular range from 17a to 17b and below, carrying most of the topographic information, are detected by detector 15. It is noted that for illustrational purposes only, the angles of the lines resembling particle groups 17a and 17b in FIG. 1 to FIG. 5 do not necessarily reflect the numeral values for the angles with respect to the specimen 3 provided in this disclosure.

By designing the SEM in this manner, as many secondary electrons coming from the specimen are all focused in common crossover 90. As the SE beam has its minimum width at this geometrical point, an aperture 100 may be positioned close to the common crossover 90 without loosing substantial signal electrons via collisions with aperture 100. Alternatively, the aperture may be provided in a region where the stray electrons have the maximum spread. Also, two or more apertures 100, 120 may be provided, for instance one as shown close to the common crossover 90, and one in the vicinity of the magnetic lens gap in an area of the maximum spread of the stray electrons. The aperture system with more than one aperture may typically have one aperture 100 with a central opening near the common crossover 90 and a second aperture 120 typically in the plane of maximum secondary electron beam spread. In FIG. 2, the optional second aperture 120 is provided in the upper part of the magnetic lens gap or just above the gap. The terms "in the vicinity of the common crossover (90)" and "near to the common crossover (90)" are intended to mean that an aperture is distanced no more than 2 cm, more typically less than 1 cm, from a position which is in the middle between the crossover of particles 18 with high a starting angle (in this particular example, 75 degrees) and the crossover of particles 19 with a low starting angle (in this particular example, 25 degrees).

According to embodiments, the aperture 100 serves for blocking electrons which would not contribute to the usable signal of the detector 15. These electrons may be, for example, high energy electrons in the SE spectrum which may collide with the electrode surfaces or liner tube walls and thus create stray electrons which would subsequently be randomly sprayed over the topographic detector 15. Some of the high energy electrons could also directly reach the detector 15. Both effects would contribute to an unwanted background signal, which would reduce signal to noise, respectively the achievable contrast ratio. Hence, by blocking undesired electrons with aperture 100, the noise produced by detector 15 is reduced, and the topographic contrast is improved.

Figure 3:
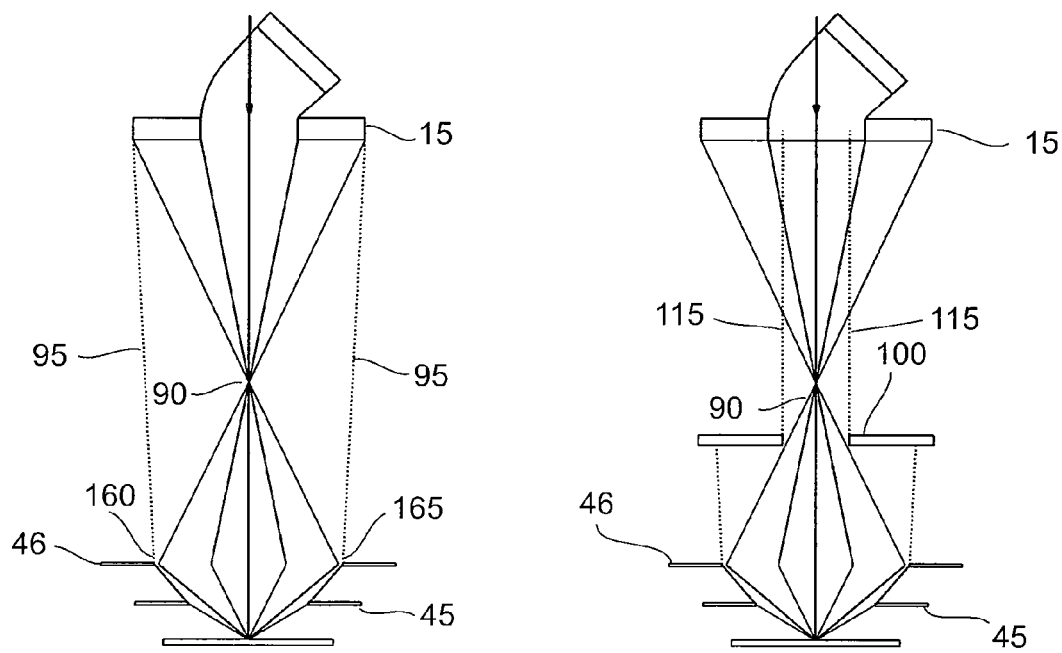
FIG. 3 shows a schematic comparison between the electron paths in an apparatus without an aperture and an apparatus having an aperture according to embodiments.

FIG. 3 schematically shows the above described blocking process of unwanted electrons or particles by aperture 100. On the left, a SEM is shown which has the same features as a SEM according to embodiments, but lacks the aperture 100. Therein, electrons or particles coming from a direction of the probe may collide with the inner edges 160, 165 of electrode 46, with liner tubes or other structures in the SEM. These unwanted electrons or particles come from a direction of the specimen and are mainly distributed in the spatial area represented by lines 95. If they hit the detector 15, they do not contribute to the usable signal, but add undesirable noise. In contradiction, in the SEM according to embodiments shown on the right of FIG. 3, these electrons or particles are mainly blocked by aperture 100. As can be seen, only a fraction of the unwanted particles may pass the aperture 100, represented by the area between lines 115. Of course, the area between lines 95, 115 is only a schematic simplification of the real angular and spatial distribution of the undesired particles, but is suitable for the illustrational purposes herein. When the size of the annular opening in the aperture is suitably chosen, i.e. slightly smaller than the opening 16 in detector 15, those electrons or particles do not reach the active area of detector 15, but pass the opening 16 of the detector. Hence, they do not contribute to the signal of detector 15 as noise. Consequently, in the embodiment shown on the right of FIG. 3, the contrast is improved in comparison to the exemplary SEM on the left. Thereby, the opening of aperture 100 is typically 0 to 40 percent smaller than the opening in the detector 15, more typically 3 to 30 percent.

The first electrode 46 in the direction of the primary electron beam (not shown in FIG. 2) may have a higher potential than the second electrode 47. Thereby, a retarding field for the primary electron beam travelling along the optical axis 70 may be generated, such that the primary electrons are decelerated before they strike the specimen 3. In an alternative typical layout of a SEM tool, both an electrostatic retarding field immersion lens and an electrostatic retarding field between a conical cap of an objective lens and the specimen may be employed as a primary electron decelerating means.

By decelerating the primary electron beam before impingement on the specimen, a high resolution can be obtained in a SEM due to low landing energies of the primary electrons. Low landing energies of the primary electrons, e.g. below 1 keV or even in the range of 50-100 eV, may for instance be realized in a low energy SEM employing, e.g. a retarding field objective lens as described above.

Hence, according to embodiments a method of inspecting a specimen with a charged particle beam device is described, which includes generating a primary charged particle beam 7 on a first optical axis; focusing the primary charged particle beam onto the specimen 3 using an objective lens device 40, 45; generating a secondary charged particle beam by the primary charged particle beam at the specimen, the secondary charged particle beam including a first group 17a of secondary charged particles starting from the specimen with high starting angles 18 and a second group 17b of secondary charged particles starting from the specimen with low starting angles 19; focusing the secondary charged particle beam, such that particles from the first group and from the second group exhibit crossovers in substantially the same distance from the specimen; blocking stray electrons with an aperture disposed between the objective lens and the crossovers; and detecting particles of the secondary charged particle beam.

Consequently, the embodiments disclosed herein allow passage of secondary electrons through the objective lens of the SEM and simultaneously a discrimination of the secondary electrons by their starting angles, i.e. the angles between their initial trajectories and the specimen surface. For instance, the detection of secondary electrons with small starting angles may be emphasized while detection of secondary electrons with high starting angles may be reduced or even avoided. As a result, a charged particle beam device and a corresponding method for inspecting a specimen is obtained, which provide imaging signals with distinct contrast, more typically distinct topographic contrast. Thereby, the use of the aperture 100 additionally increases contrast by blocking unwanted electrons.

In one typical example of embodiments disclosed herein, between the objective lens 40, 45 and the specimen 3 an extraction field of a few 100 V, typically about 100 to 3000 V/mm, more typically about 400 to about 1000 V/mm may be employed, most typically of about 1000 V/mm.

Figure 4:
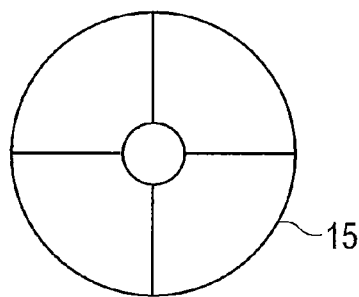
FIG. 4 shows a top view on an example of a detector according to embodiments.

In modifications of examples of embodiments disclosed herein, the detector 15 may include at least one element selected from the group consisting of an in-lens detector, a detector positioned outside of the lens, an annular detector, a segmented detector, a fiber optic based detector, a position sensitive detector, a detector including an array of detection diodes, and a retarding field analyzer. Hence, the detector may be of simple annular shape, or may have any other structure allowing discrimination between a central area and outside area of the electron illumination. The annular detector may be divided in individual segments, e.g. segments for top or bottom or left or right perspective of the imaging signals. For instance, the detector may include two annular segments or four annular segments as shown in FIG. 4. Furthermore, the detector 15 may possess any combination of the typical characteristics of the aforementioned detectors. The central aperture/opening 16 thereby defines the angular range of the electrons separated between high angle detector 150 (described further below) and the topographic detector 15. The cut-off angle can be influenced either by the position of the detector 15, position of the crossover 90 or size of the aperture 16.

In an embodiment, each segment of the four segments of detector 15 detects a defined portion of the secondary particle angular spectrum (polar and azimuthal) and thus creates topographic contrast. Thereby, the contrast is mainly caused by shadowing on the declined sides of topographic features.

Moreover, the objective lens device 40, 45 of examples of embodiments disclosed herein may include at least one element of the group consisting of a retarding field lens, a focusing lens, a magnetic lens, an electrostatic lens, and an electrostatic-magnetic lens. The charged particle beam device may further include a beam deflection device, a secondary charged particle beam deflection device, a transfer lens device, and a transfer lens device in combination with a secondary charged particle beam deflection device.

Further, the position of the common crossover 90 and the distance between it and the specimen 3 may be modified using other devices influencing the first and the second groups 17a and 17b of secondary electrons, typically by magnetic and/or electrostatic fields. Thereby, in a further example of embodiments disclosed herein, the focuses of the different groups of electrons representing different starting angles may be adjusted in order to maintain that they commonly exhibit the common crossover 90, respectively that their individual crossoveres have substantially the same distance from specimen 3 within the tolerances described above. This aim may be achieved by adjustment of the objective lens device 40, 45 alone or by other adjustable elements generating electrostatic or magnetic fields, or by a combination of both alternatives. Further, a deflector may be placed between the objective lens 40, 45 and the detector 15 for adjustment of the symmetrical detection on the individual detector segments of detector 15.

In embodiments, a second detector 150 may be provided, also referred to as high angle detector. It is provided along a second optical axis 75 at a position to detect groups of electrons having higher starting angles than those of group 17a in FIG. 2, thus passing through opening 16 in detector 15. They are then deflected in the direction of optical axis 75. The detector 150 may be a position sensitive in-line detector. More typically the detector 150 may be an annular detector such as was described for detector 15, or may be any of the detectors listed above for the detector 15. As was already laid out, these secondary electrons have high starting angles and carry little topographic information. However, the secondary electrons passing through detector 15 may provide information about the localization of the edges and are thus suitable for Critical Dimensions (CD) measurements. Hence, according to the present example, groups 17a and 17b of secondary electrons, along with electrons having higher starting angles may be detected in one imaging tool, allowing discrimination of the electrons by their starting angles and detailed imaging.

In the embodiment disclosed above, the charged particle beam device also includes a beam separation device 125 adapted to separate the primary particle beam from the groups of secondary charged particles passing through detector 15.

Figure 5:
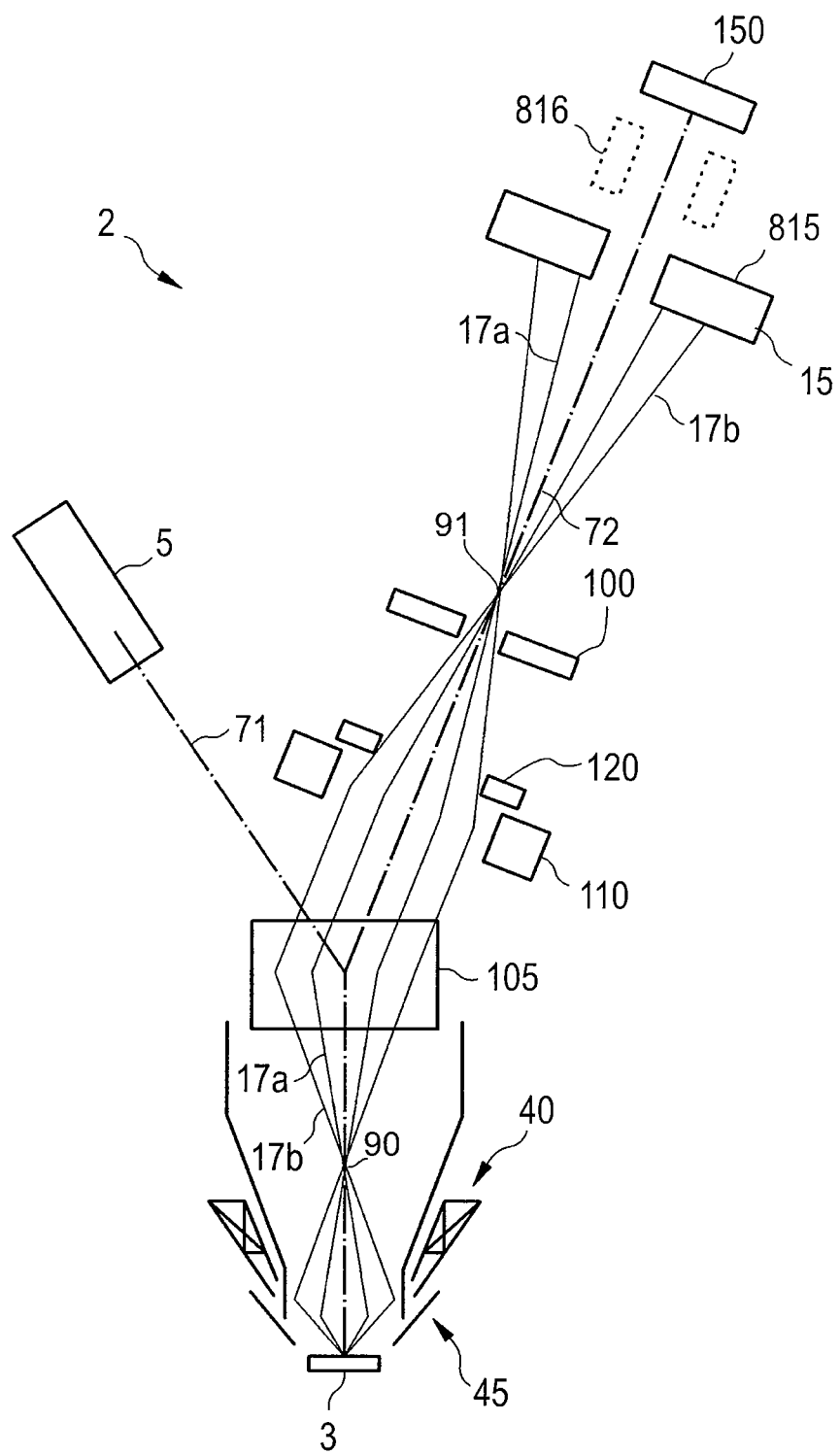
FIG. 5 shows an example of a particle beam apparatus according to embodiments.

According to one example of embodiments disclosed herein and schematically shown in FIG. 5, a SEM 2 may include an electron beam source 5 generating a primary electron beam along a first optical axis 71. Furthermore, a beam separation device 105 is provided, which includes a first beam deflector (not shown) for deflecting the primary electron beam into the combined electrostatic and magnetic lens 40, 45, which focuses the primary electron beam onto the specimen 3. The beam separation device 105 includes a second beam deflector (not shown) for deflecting the first and second group 17a, 17b of secondary electrons along a second optical axis 72. A transfer lens device 110, which may include an electrostatic and/or magnetic focusing lens, may be positioned adjacent to the beam separation device 105. Furthermore, the detectors 15 and 150 are provided along the second optical axis 72. Thereby, high angle detector 150 may be provided in opening 16 of detector 15 in embodiments, thus forming a homogeneous detector element (not shown). Detector 150 may also be provided in a greater distance from device 105, as is shown in FIG. 5. The aperture 100 for blocking stray electrons as already described is typically provided in the vicinity of common crossover 91. Optionally, a second aperture 120 may be provided in embodiments, typically just before or behind a transfer lens 110. Second aperture 120 may be provided as a normal circular aperture or as an annular aperture in this case.

Hence, according to one example, the objective lens device includes the combined electrostatic and magnetic lens 40, 45, the beam separation device 105, and the transfer lens device 110.

In operation, the SEM 2 generates the primary electron beam along the first optical axis 71. The beam separation device 105 deflects the primary electron beam into the combined electrostatic and magnetic lens 40, 45, which focuses the primary electron beam onto the specimen 3. The first group 17a of secondary charged particles starting from the specimen 3 with high starting angles and the second group 17b of secondary charged particles starting from the specimen with low starting angles pass through the objective lens 40, 45 into the beam separation device 105. The beam separation device 105 deflects the first and second group 17a, 17b of secondary electrons in a direction along the second optical axis 72. The transfer lens device 110 focuses the at least one group of the first and the second group of secondary charged particles along the second optical axis 72 and produces the common crossover 91 along, typically on, the second optical axis 72. Aperture 100 is provided in the vicinity of common crossover 91 and blocks stray electrons as described above, thus improving contrast of detectors 15 and 150.

The beam separation device 105 may include at least one element selected from the group of a deflector, a magnetic deflector, a sector field deflection unit, a combination of two, three or four magnetic deflectors (so-called 2B, 3B, or 4B deflectors), a combination of a magnetic and an electrostatic deflector, e.g. a Wien filter, and a dispersion free combined magnetic-electrostatic deflection unit. Furthermore, in the beam separation device 105 a deflection enhancing unit may be included, which is positioned and adapted to further deflect at least one group of the first and the second groups of secondary charged particles after the separation of the primary particle beam from the at least one group of the first and the second groups of secondary charged particles. Hence, the deflection of the secondary electrons may be further enhanced by a deflector included in the beam separation device 105 influencing only the secondary electrons after beam separation in the beam separation device 105.

According to a modification of the present example of embodiments disclosed herein, only one group of the first and the second groups of secondary electrons may be deflected along the second optical axis after the separation from the primary particle beam.

Further examples of such analyzing systems are described in U.S. patent application Ser. No. 11/384,044, filed Mar. 17, 2006, which has been published as U.S. 2006/0226361, and being entitled "Analyzing system and charged particle beam device", which is incorporated herein by reference to the extent the applications are not inconsistent with this disclosure.

In a modification of any of the above one embodiment and modifications thereof, one or more of the charged particle detectors may include at least one element selected from the group consisting of an in-lens detector, a detector positioned outside of the lens, an annular detector, a segmented detector, a fiber optic based detector, a position sensitive detector, a detector including an array of detection diodes, and a retarding field detector.

In a modification of any of the above one embodiment and modifications thereof, the objective lens device may include at least one element of the group consisting of a retarding field lens, a focusing lens, a magnetic lens, an electrostatic lens, and an electrostatic-magnetic lens.

In a modification of any of the above one embodiment and modifications thereof, which may be combined with any other embodiment and/or modification described herein, the charged particle beam device further includes a beam deflection device, a secondary charged particle beam deflection device, a transfer lens device, a transfer lens device in combination with a secondary charged particle beam deflection device, and a beam separation device adapted to separate the primary particle beam from at least one group of the first and the second group of secondary charged particles.

In a modification of any of the above one embodiment and modifications thereof, the charged particle beam source is adapted to generate the primary charged particle beam along a first optical axis, the charged particle beam device further includes a beam separation device adapted to separate the primary particle beam from the secondary charged particles, and a transfer lens device positioned adjacent to the beam separation device and adapted to direct the secondary charged particles in a direction along a second optical axis, and wherein at least one of the first and the second charged particle detectors is positioned along the second optical axis.

In a modification of any of the above one embodiment and modifications thereof, the beam separation device may include at least one element selected from the group of a deflector, a magnetic deflector, a sector field deflection unit, a combination of two, three or four magnetic deflectors, a combination of a magnetic and an electrostatic deflector, a Wien filter, a dispersion free combined magnetic-electrostatic deflection unit, and a deflection enhancing unit positioned and adapted to further deflect the at least one group of the first and the second groups of secondary charged particles after the separating of the primary particle beam from the at least one group of the first and the second groups of secondary charged particles.

In a modification of any of the above one embodiment and modifications thereof, the first charged particle detector may include a retarding field analyzer adapted to reflect and/or detect the secondary charged particles.

In a modification of any of the above one embodiment and modifications thereof, the first group of secondary charged particles may have starting angles in the range of 45 degrees to 90 degrees, and the second group of secondary charged particles may have low starting angles in the range of 0 to 45 degrees.

In a modification of any of the above one embodiment and modifications thereof, the distance of the first crossover 90 to the specimen may be in a range of 50 to 150 mm, and the detector may be an annular detector having an annular aperture of a diameter of 0.5 to 5 mm.

In a modification of any of the above one embodiment and modifications thereof, between the objective lens device and the specimen an extraction field of 100 to 3000 V/mm may be applied.

In a modification of any of the above yet further embodiment and modifications thereof, the objective lens device includes at least one element of the group consisting of a retarding field lens, a focusing lens, a magnetic lens, an electrostatic lens, and an electrostatic-magnetic lens.

In a modification of any of the above yet further embodiment and modifications thereof, the secondary charged particles may be reflected and/or detected by a retarding field analyzer.

The written description uses examples to disclose the invention, including the best mode, and also to enable any person skilled in the art to make and use the invention. While the invention has been described in terms of various specific embodiments, those skilled in the art will recognize that the invention can be practiced with modifications within the spirit and scope of the claims. Especially, mutually non-exclusive features of the embodiments described above may be combined with each other. The patentable scope of the invention is defined by the claims, and may include other examples that occur to those skilled in the art. Such other examples are intended to be within the scope of the claims.

While the foregoing is directed to embodiments of the invention, other and further embodiments of the invention may be devised without departing from the basic scope thereof, and the scope thereof is determined by the claims that follow.

The invention claimed is:

1. A charged particle beam device for inspecting a specimen, comprising
a charged particle beam source adapted to generate a primary charged particle beam;
an objective lens device adapted to direct the primary charged particle beam onto the specimen;
a retarding field device adapted to accelerate secondary charged particles starting from the specimen, wherein a first group of the secondary charged particles comprises secondary charged particles starting from the specimen with high starting angles, and a second group of the secondary charged particles comprises secondary charged particles starting from the specimen with low starting angles;

a first detector device, comprising
at least two detector segments for detecting secondary particles, wherein the first detector device is configured to detect the second group of secondary charged particles, and wherein the first detector device has an opening for letting pass the first group of secondary charged particles or an opening configured for having at least one second detector device provided in the opening;

wherein the objective lens device is adapted such that particles with different starting angles from the specimen exhibit crossovers at substantially the same distance from the specimen, forming a common crossover, and a first aperture located between the objective lens and the detector, having an opening with a diameter equal to or smaller than the central opening in the detector device, and which is provided in a position which fulfills at least one of the following properties:
(i) it is in the vicinity of the common crossover,
(ii) it is at a position where stray particles exhibit a maximum spread.

2. The device of claim 1, further comprising a second aperture.

3. The device of claim 2, wherein the second aperture is located at a position fulfilling at least one of the properties (i) or (ii).

4. The device of claim 1, further comprising at least one of:
a secondary charged particle beam deflection device, a transfer lens device, a transfer lens device in combination with a secondary charged particle beam deflection device, and a beam separation device, adapted to separate the primary particle beam from at least one of the first and the second group of secondary charged particles.

5. The device of claim 1, wherein the charged particle beam source is adapted to generate the primary charged particle beam along a first optical axis, the charged particle beam device further comprising a beam separation device adapted to separate the primary particle beam from at least one group of the first and the second group of secondary charged particles, a transfer lens device positioned adjacent to the beam separation device and adapted to direct the at least one of the first and the second group of secondary charged particles in a direction along a second optical axis, and wherein the at least one second detector device is positioned along the second optical axis.

6. The device of claim 5, wherein the first detector device is positioned along the second optical axis, and wherein the second detector device (150) is provided in the center of first detector device.

7. The device of claim 1, further comprising means for adjusting the position of the secondary particle beam common crossover with respect to the first or second optical axis.

8. A method of inspecting a specimen with a charged particle beam device, comprising
generating a primary charged particle beam on a first optical axis;
focusing the primary charged particle beam onto the specimen using an objective lens device;
generating a secondary charged particle beam by the primary charged particle beam at the specimen, the secondary charged particle beam comprising a first group of secondary charged particles starting from the specimen with high starting angles and a second group of secondary charged particles starting from the specimen with low starting angles;
focusing the secondary charged particle beam, such that particles from the first group and from the second group exhibit crossovers in substantially the same distance from the specimen, forming a common crossover;
blocking stray particles with a first aperture disposed between the objective lens and the detector; and,
detecting particles of the secondary charged particle beam, wherein the detecting comprises at least:
detecting the second group of secondary charged particles with a first detector, wherein the first detector device has an opening for letting pass the first group of secondary charged particles or an opening configured for having at least one second detector device provided in the opening.

9. The method of claim 8, further comprising:
adjusting a position of the common crossover of the secondary particle beam in a direction of the optical axis.

10. The method of claim 8, further comprising:
adjusting the alignment of the secondary particle beam with respect to the first aperture and a detector in order to optimize a contrast detected by detector.

11. The method of claim 8, wherein the primary charged particle beam is generated along a first optical axis, the primary particle beam is separated from the secondary charged particles, and the secondary charged particles are directed in a direction along a second optical axis, and the secondary charged particles are detected along the second optical axis.

12. The method of claim 8, wherein secondary charged particles of the first group have starting angles to the specimen above 45 degrees, and secondary charged particles of the second group have starting angles to the specimen from 0 degrees to 45 degrees.

13. The method of claim 8, wherein a distance between the first aperture and the common crossover of secondary charged particles with different starting angles is smaller than 2 cm.

14. The method of claim 8, wherein the aperture is located in the vicinity of the common crossover of the secondary particles.

15. The method of claim 8, wherein the objective lens device comprises at least one element of the group consisting of a retarding field lens, a focusing lens, a magnetic lens, an electrostatic lens, and an electrostatic-magnetic lens.

* * * * *

UNITED STATES PATENT AND TRADEMARK OFFICE
CERTIFICATE OF CORRECTION

PATENT NO. : 8,530,837 B2
APPLICATION NO. : 13/204528
DATED : September 10, 2013
INVENTOR(S) : Pavel Adamec It is certified that error appears in the above-identified patent and that said Letters Patent is hereby corrected as shown below:

In the Specification:

Column 5, Line 29, please delete "loosing" and insert --losing-- therefor;

Column 7, Line 55, please delete "crossoveres" and insert --crossovers-- therefor.

Signed and Sealed this
Fourth Day of February, 2014

Michelle K. Lee
*Deputy Director of the United States Patent and Trademark Office*